United States Patent
Lee et al.

(10) Patent No.: US 11,159,727 B2
(45) Date of Patent: Oct. 26, 2021

(54) REFLECTION MODULE FOR OPTICAL IMAGE STABILIZATION AND CAMERA MODULE INCLUDING THE SAME

(71) Applicant: Samsung Electro-Mechanics Co., Ltd., Suwon-si (KR)

(72) Inventors: Hong Joo Lee, Suwon-si (KR); Young Bok Yoon, Suwon-si (KR); Nam Ki Park, Suwon-si (KR); Ta Kyoung Lee, Suwon-si (KR); Jung Woo Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/663,761

(22) Filed: Oct. 25, 2019

(65) Prior Publication Data
US 2020/0404181 A1    Dec. 24, 2020

(30) Foreign Application Priority Data
Jun. 18, 2019  (KR) .................. 10-2019-0072018

(51) Int. Cl.
*H04N 5/232*    (2006.01)
*G02B 7/182*    (2021.01)
(Continued)

(52) U.S. Cl.
CPC ......... *H04N 5/23287* (2013.01); *G01R 33/07* (2013.01); *G02B 7/09* (2013.01);
(Continued)

(58) Field of Classification Search
CPC ............. H04N 5/23287; H04N 5/2254; H04N 5/23296; H04N 5/2252; G02B 7/182;
(Continued)

(56) References Cited

U.S. PATENT DOCUMENTS

| | | |
|---|---|---|
| 10,678,062 B2 | 6/2020 | Im et al. |
| 2013/0163085 A1 | 6/2013 | Lim et al. |

(Continued)

FOREIGN PATENT DOCUMENTS

| | | |
|---|---|---|
| CN | 103900452 A | 7/2014 |
| CN | 206975303 U | 2/2018 |

(Continued)

OTHER PUBLICATIONS

Korean Office Action dated Jun. 16, 2020 in corresponding Korean Patent Application No. 10-2019-0072018 (9 pages in English, 6 pages in Korean).

(Continued)

*Primary Examiner* — Gevell V Selby
(74) *Attorney, Agent, or Firm* — NSIP Law

(57) ABSTRACT

A reflection module for optical image stabilization includes a rotation holder, which includes a reflection member and is supported on an internal wall of a housing, and a driving part to provide driving force to move the rotation holder. The driving part includes a magnet disposed on the rotation holder, a coil disposed in the housing and opposing the magnet, and a hall sensor disposed in the housing and opposing an N pole or an S pole of the magnet.

15 Claims, 21 Drawing Sheets

(51) Int. Cl.
  *G02B 13/00*  (2006.01)
  *G02B 7/09*   (2021.01)
  *G01R 33/07*  (2006.01)
  *G03B 13/36*  (2021.01)
  *H04N 5/225*  (2006.01)
  *G02B 7/10*   (2021.01)

(52) U.S. Cl.
  CPC ............... *G02B 7/10* (2013.01); *G02B 7/182* (2013.01); *G02B 13/009* (2013.01); *G03B 13/36* (2013.01); *H04N 5/2252* (2013.01); *H04N 5/2254* (2013.01); *H04N 5/23296* (2013.01)

(58) Field of Classification Search
  CPC .......... G02B 13/009; G02B 7/10; G02B 7/09; G03B 13/36; G01R 33/07
  See application file for complete search history.

(56) References Cited

U.S. PATENT DOCUMENTS

| | | | |
|---|---|---|---|
| 2014/0184208 A1 | 7/2014 | Kouno et al. | |
| 2015/0002683 A1* | 1/2015 | Hu | G02B 26/0816 348/208.2 |
| 2015/0042840 A1* | 2/2015 | Komatsu | G06T 3/0081 348/222.1 |
| 2016/0109721 A1 | 4/2016 | Min et al. | |
| 2018/0224665 A1* | 8/2018 | Im | G02B 7/021 |
| 2018/0364446 A1 | 12/2018 | Osaka et al. | |
| 2018/0364450 A1* | 12/2018 | Lee | G02B 7/09 |
| 2018/0367714 A1 | 12/2018 | Im et al. | |

FOREIGN PATENT DOCUMENTS

| | | |
|---|---|---|
| CN | 108398806 A | 8/2018 |
| CN | 207992659 U | 10/2018 |
| CN | 109143526 A | 1/2019 |
| JP | 2006-72251 A | 3/2006 |
| JP | 2016-066090 A | 4/2016 |
| KR | 10-2013-0072721 A | 7/2013 |
| KR | 10-2016-0045385 A | 4/2016 |
| KR | 10-2018-0092251 A | 8/2018 |

OTHER PUBLICATIONS

Chinese Office Action dated Jun. 30, 2021 issued in counterpart Chinese Patent Application No. 202010026859.5 (7 pages in English and 7 pages in Chinese).

* cited by examiner

REFLECTION MODULE FOR OPTICAL IMAGE STABILIZATION AND CAMERA MODULE INCLUDING THE SAME

CROSS-REFERENCE TO RELATED APPLICATION(S)

This application claims the benefit under 35 USC 119(a) of Korean Patent Application No. 10-2019-0072018 filed on Jun. 18, 2019 in the Korean Intellectual Property Office, the entire disclosure of which is incorporated herein by reference for all purposes.

BACKGROUND

1. Field

The following description relates to a reflection module for optical image stabilization (OIS) and a camera module including the same.

2. Description of Background

Recently, camera modules have been commonly installed in portable electronic devices such as tablet personal computers (PCs), laptop computers, and the like, in addition to smartphones, and an autofocusing function, an optical image stabilization (OIS) function, a zoom function, and the like, have been added to camera modules for mobile terminals.

However, in order to implement various functions, structures of camera modules have become complicated and sizes of camera modules have increased. As a result, sizes of portable electronic devices, in which camera modules are mounted, have increased.

Also, in order to improve zoom functions, a camera module, included in a mobile terminal, includes a folded module refracting light using a reflection member. The folded module may implement an optical image stabilization (OIS) function while refracting light using the reflection member.

When light is refracted using a reflection member, the reflection member needs to be finely adjusted. Therefore, accurate position sensing is required. However, a hall sensor, provided in the winding of a conventional coil, suffers from issues such as position distortion, caused by a limitation in disposed position when current is applied to a coil, and a significant deterioration in position sensing accuracy occurring even when a position of a magnet is slightly shifted by an assembly tolerance or an external impact.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

A folded module camera including a hall sensor which may significantly reduce an influence, arising from current applied to a coil, and significantly reduce a deterioration in position sensing accuracy even when a position of a magnet is slightly shifted by an assembly tolerance or an external impact, and may increase sensing sensitivity, depending on a relative position with the magnet to improve sensing accuracy.

In one general aspect, a reflection module for optical image stabilization includes a rotation holder, which includes a reflection member and is supported on an internal wall of a housing, and a driving part to provide driving force to move the rotation holder. The driving part includes a magnet disposed on the rotation holder, a coil disposed in the housing and opposing the magnet, and a hall sensor disposed in the housing and opposing an N pole or an S pole of the magnet.

The coil and the hall sensor may be mounted on a circuit board, and the circuit board may be fixed to the housing.

The hall sensor may be disposed outside coil windings of the coil.

The hall sensor may not oppose a neutral zone adjacent to where the N pole and the S pole of the magnet meet.

The hall sensor may be disposed on the N pole or the S pole of the magnet at a position in which a greatest absolute value of flux density is sensed.

A center of the hall sensor may oppose a center of the N pole of the magnet or a center of the S pole of the magnet.

The hall sensor may include two hall sensors, respectively disposed outside opposite sides of coil windings of the coil.

The magnet may be disposed on a bottom surface of the rotation holder, and the coil may be disposed on a bottom surface of the housing.

The hall sensor may have a flux density value varying depending on a relative distance from the magnet.

The hall sensor may have a greater amount of change in the flux density value when the hall sensor opposes the N pole or the S pole of the magnet than when the hall sensor opposes a neutral zone of the magnet.

The hall sensor may have a greater flux density value when the hall sensor opposes the N pole or the S pole of the magnet than when the hall sensor opposes a neutral zone of the magnet.

The rotation holder may rotate such that the reflection member is tilted in a direction perpendicular to an optical axis.

In another general aspect, a camera module includes a housing defining an internal space; a reflection module disposed in the internal space and including a rotation holder having a reflection member and supported on an internal wall of the housing and a driving part to provide driving force to move the rotation holder; and a lens module including a lens barrel having a plurality of lenses, and aligned in an optical axis direction such that reflected light is incident on the reflection member. The driving part includes a magnet disposed on the rotation holder, a coil disposed in the housing and opposing the magnet, and a hall sensor disposed in the housing and opposing an N pole or an S pole of the magnet. The lens module is disposed such that the lens barrel is selectively movable along an optical axis.

The hall sensor may include at least one hall sensor that opposes the N pole of the magnet and at least one hall sensor that opposes the S pole of the magnet.

The hall sensor may include two hall sensors that oppose the N pole of the magnet and two hall sensors that oppose the S pole of the magnet.

The two hall sensors that oppose the N pole of the magnet may be disposed on opposite sides of the coil with respect to the optical axis, and the two hall sensors that oppose the S pole of the magnet may be disposed on opposite sides of the coil with respect to the optical axis.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
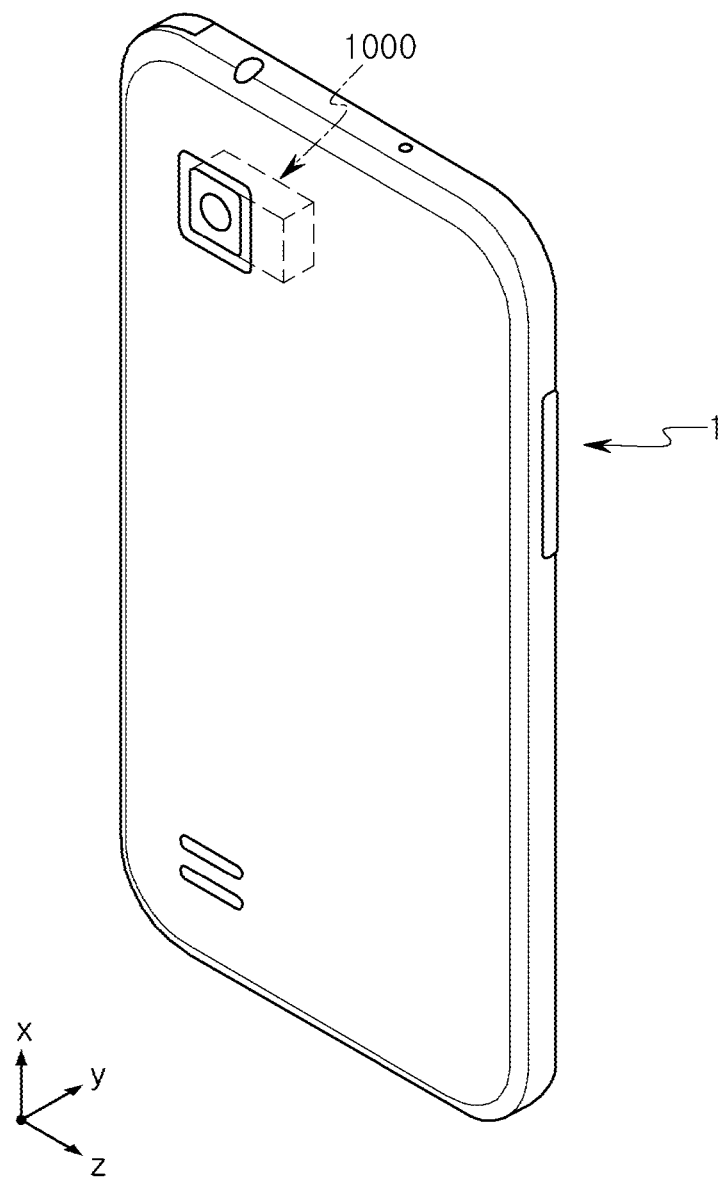
FIG. 1 is a perspective view of a portable electronic device according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Hereinafter, examples will be described with reference to the attached drawings.

FIG. 1 is a perspective view of a portable electronic device according to an example.

Referring to FIG. 1, a portable electronic device 1 may be a portable electronic device such as a mobile communications terminal, a smartphone, a tablet personal computer (PC), or the like, in which a camera module 1000 is mounted.

As illustrated in FIG. 1, the portable electronic device 1 is provided with the camera module 1000 to capture an image of a subject.

In this example, the camera module 1000 includes a plurality of lenses, and the optical axis (a Z axis) of each of the lenses is directed in a direction perpendicular to a thickness direction (a Y-axis direction or a direction from a front surface of the portable electronic device 1 to a rear surface thereof or an opposite direction to the direction from the front surface of the portable electronic device 1 to the rear surface thereof) of the portable electronic device 1.

As an example, the optical axis (the Z axis) of each of the lenses, included in the camera module 1000, is in a width or length direction of the portable electronic device 1.

Therefore, even if the camera module 1000 has functions including an autofocusing (AF) function, a zoom function, an optical image stabilization (OIS) function, the thickness of the portable electronic device 1 is not increased. Accordingly, the portable electronic device 1 may be miniaturized.

The camera module 1000 according to an example may have at least one of the AF function, the zoom function, and the OIS function.

Since the camera module 1000, having the AF function, the zoom function, the OIS function, and the like, needs to include various components, a size of the camera module 1000 is increased, as compared with a general camera module.

When the size of the camera module 1000 is increased, there may be a problem in miniaturizing the portable electronic device 1 in which the camera module 1000 is mounted.

For example, when the number of stacked lenses in the camera module is increased for the zoom function and the stacked lenses are disposed in the camera module in the thickness direction of the portable electronic device, thickness of the portable electronic device is increased depending on the number of the stacked lenses. Accordingly, when the thickness of the portable electronic device is not increased, the number of stacked lenses may not be sufficiently secured, such that zoom performance deteriorates.

In addition, an actuator, moving a lens group in an optical axis direction or a direction perpendicular to the optical axis, needs to be installed to implement the AF function and the OIS function. When the optical axis (the Z axis) of the lens group is in the thickness direction of the portable electronic device 1, the actuator, moving the lens group, also needs to be installed in the thickness direction of the portable electronic device 1. Accordingly, thickness of the portable electronic device 1 is increased.

However, in the camera module 1000 according to an example, the optical axis (the Z axis) of each of the lenses is disposed to be perpendicular to the thickness direction of the portable electronic device 1. Accordingly, even when the camera module 1000, having the AF function, the zoom function, and the OIS function, is mounted in the portable electronic device 1, the portable electronic device 1 may be miniaturized.

Figure 2:
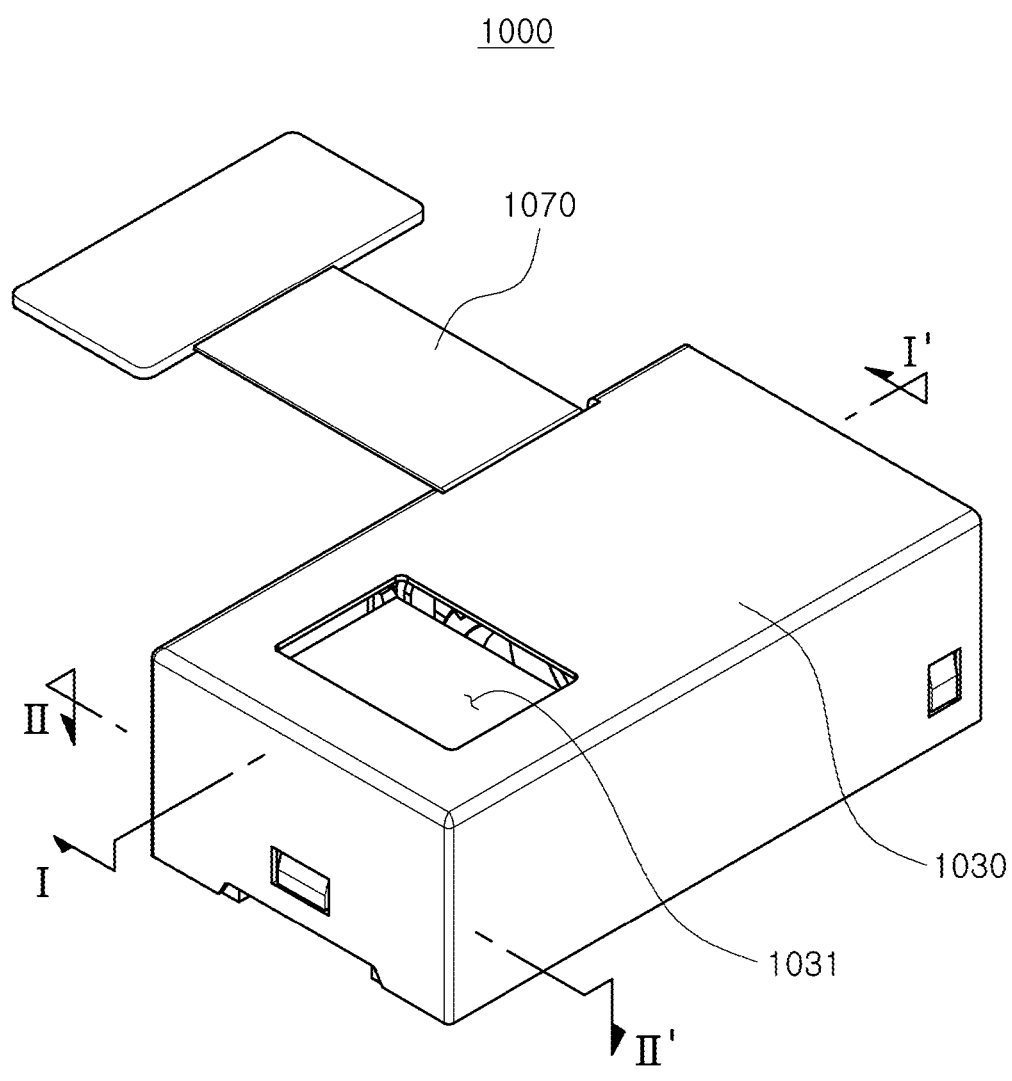
FIG. 2 is a perspective view of a camera module according to an example.
Figure 3A:
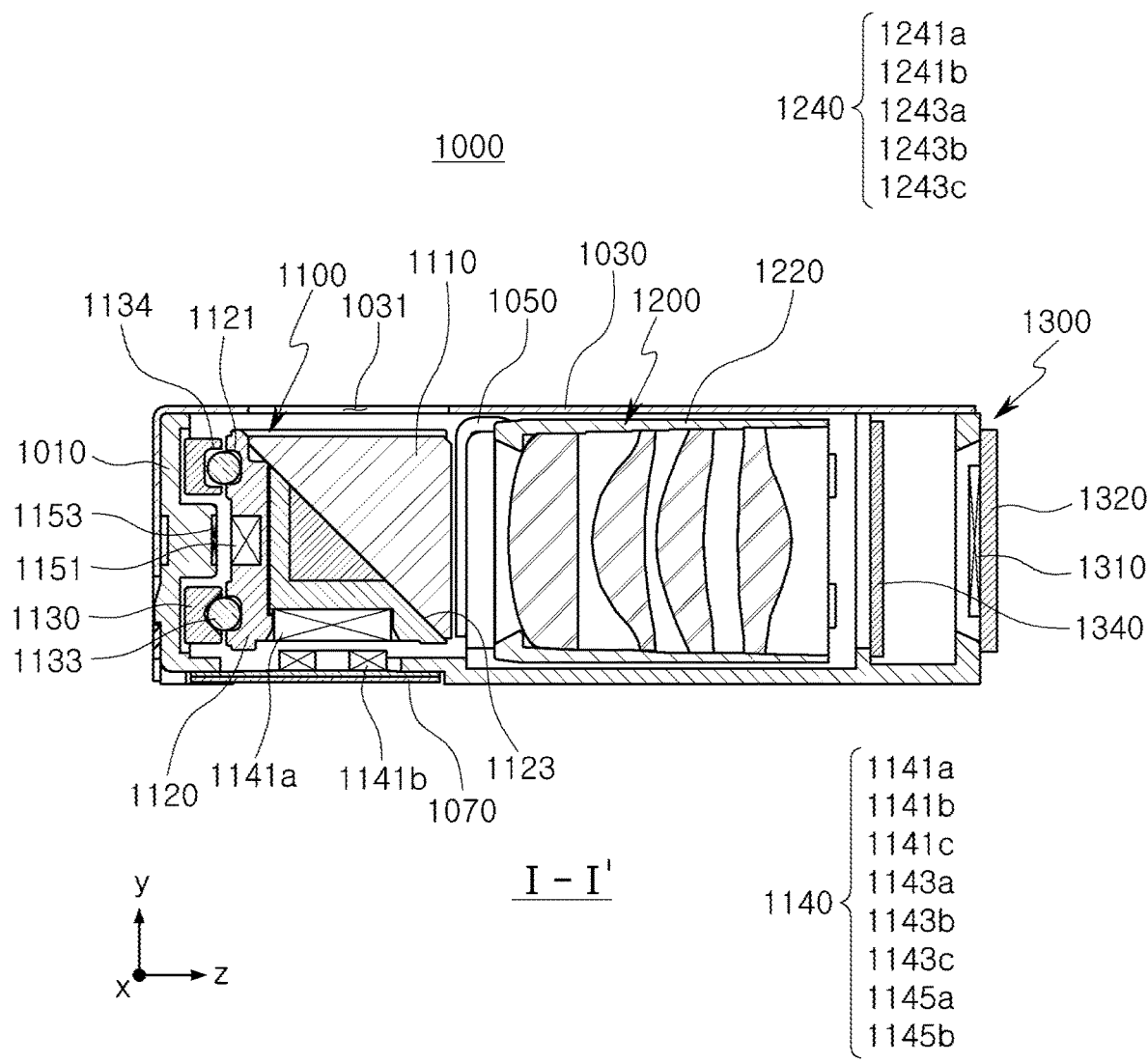
FIGS. 3A and 3B are cross-sectional views of a camera module according to an example.
Figure 3B:
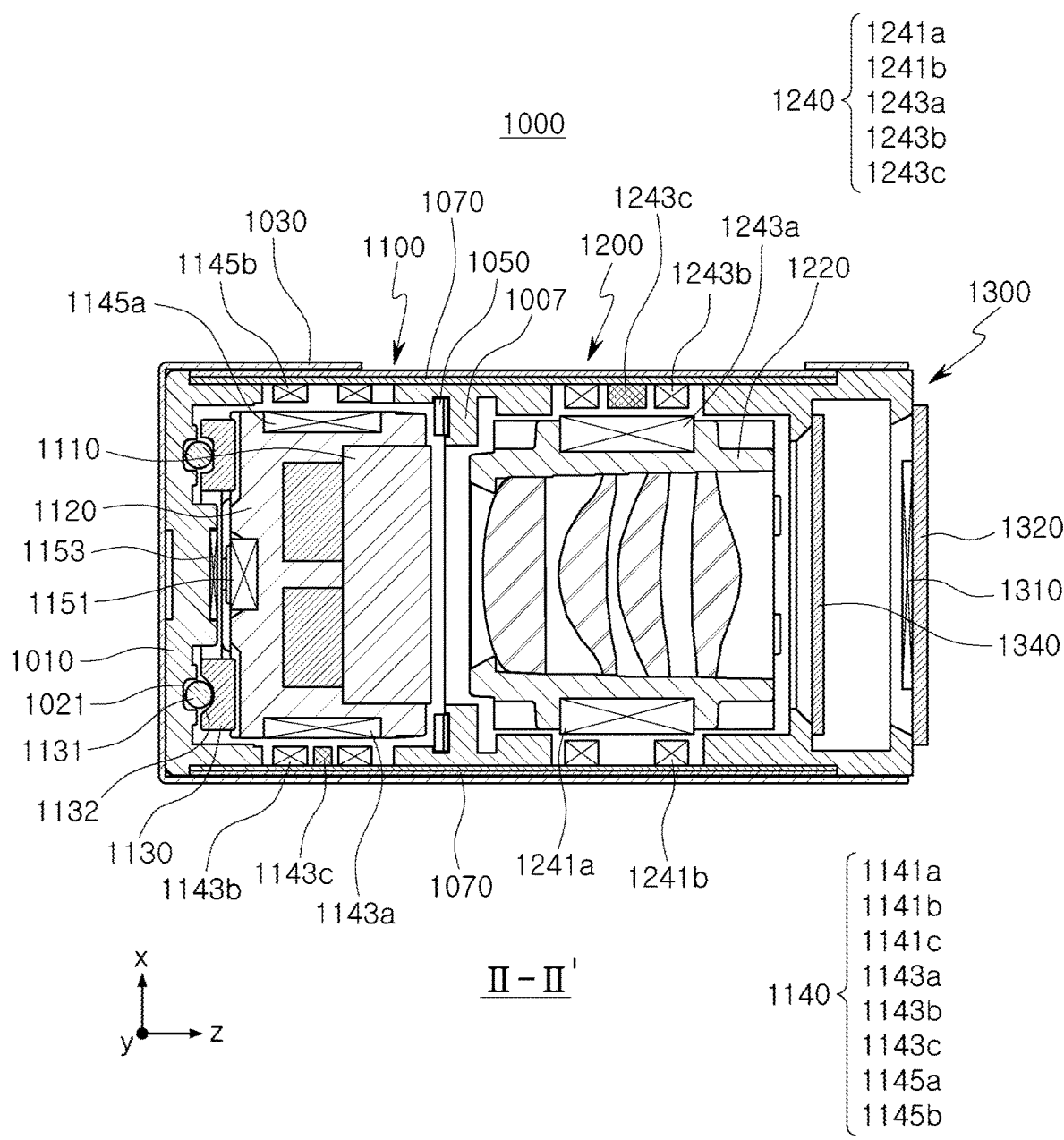
Figure 4:
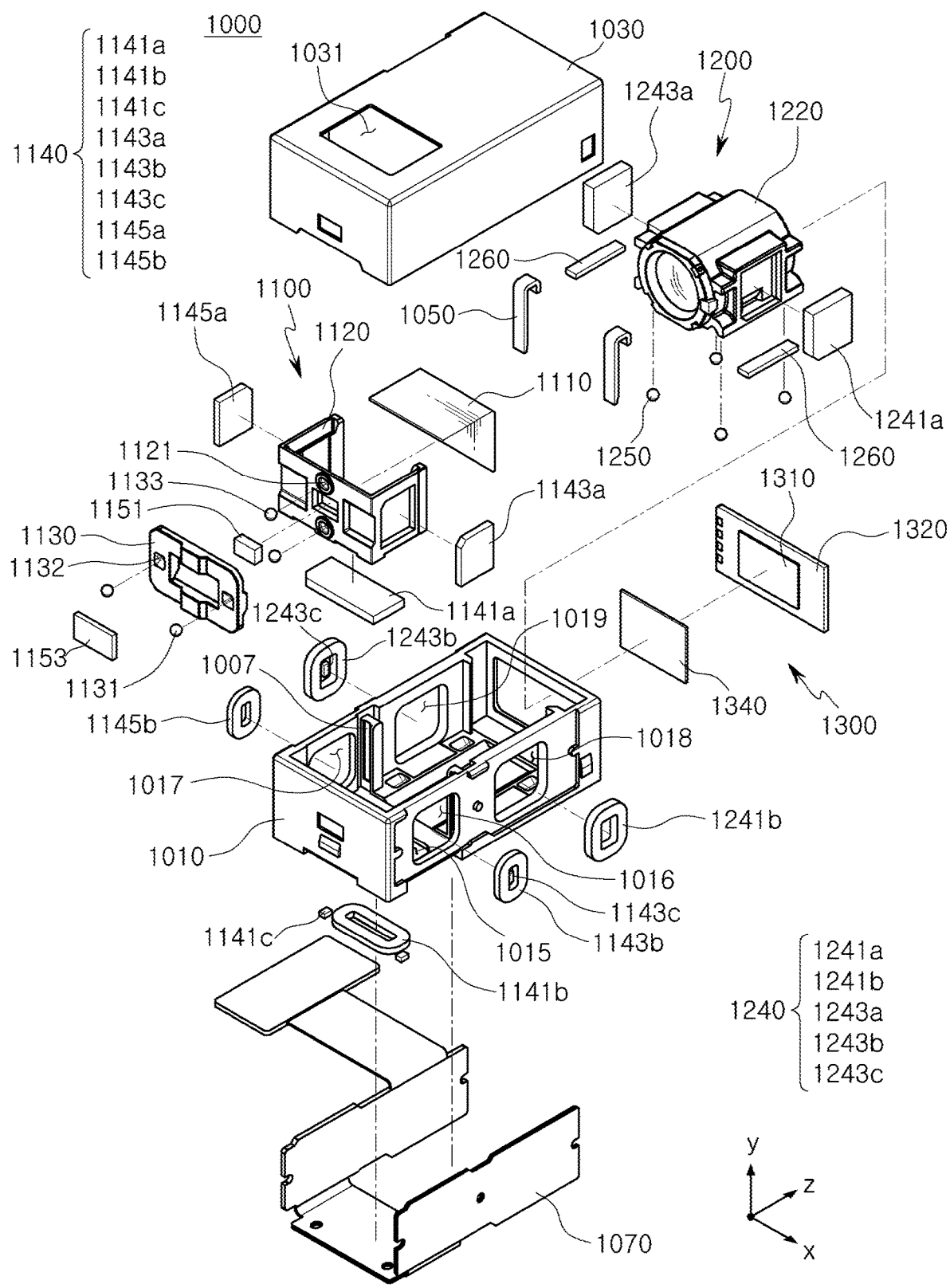
FIG. 4 is an exploded perspective view of a camera module according to an example.
Figure 5:
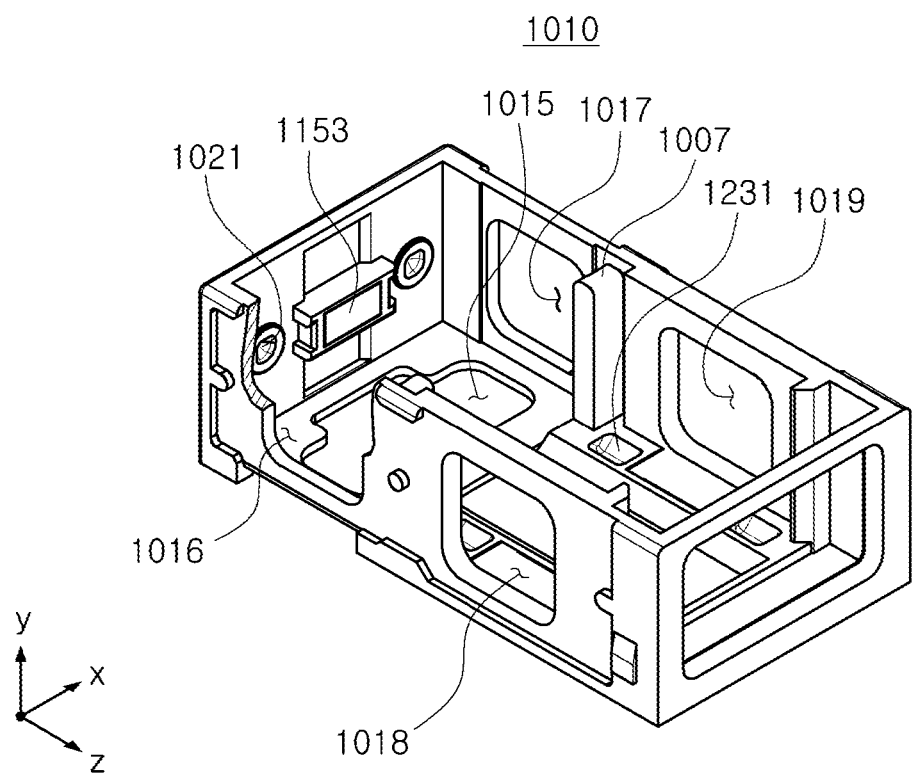
FIG. 5 is a perspective view of a housing of a camera module according to an example.
Figure 6:
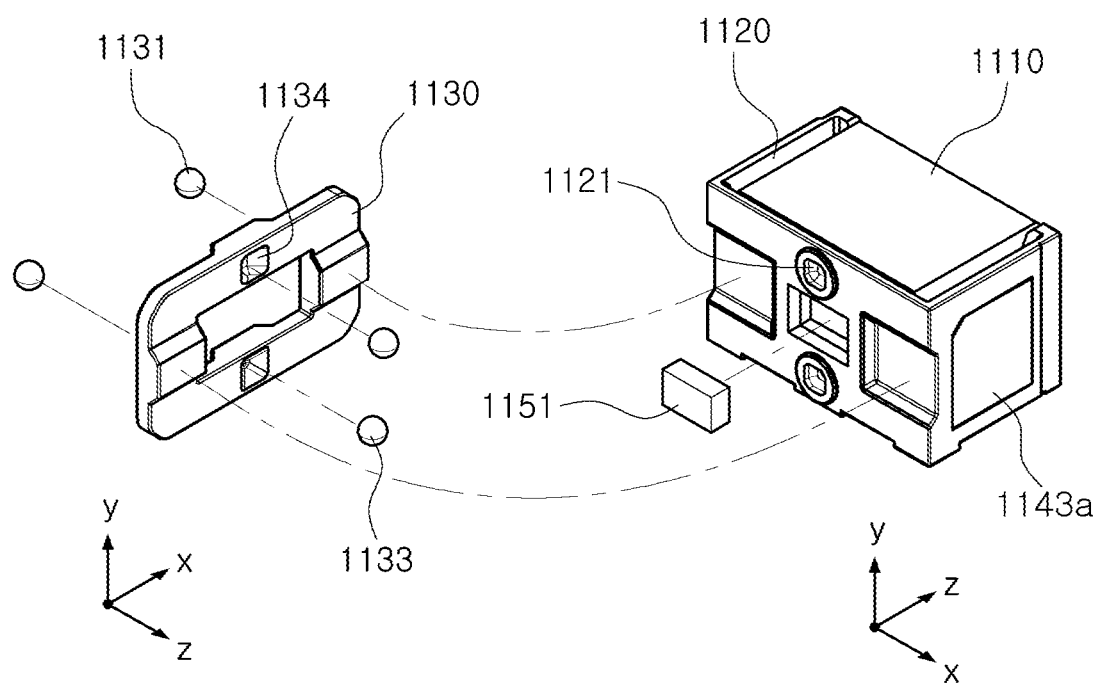
FIG. 6 is an exploded perspective view of a rotation plate and a rotation holder of a camera module according to an example.
Figure 7:
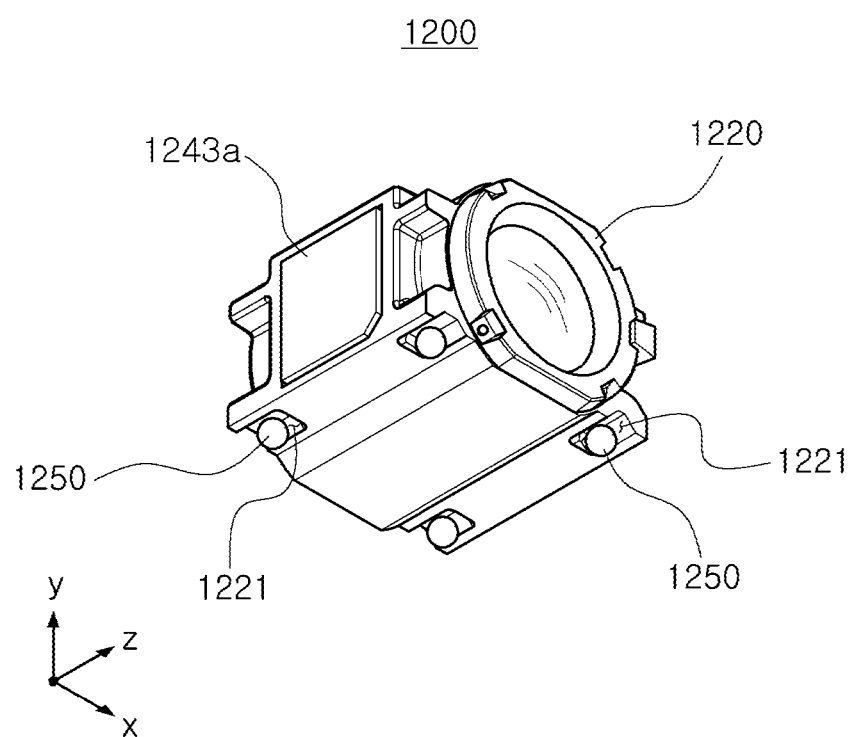
FIG. 7 is a perspective view of a lens holder of a camera module according to an example.
Figure 8:
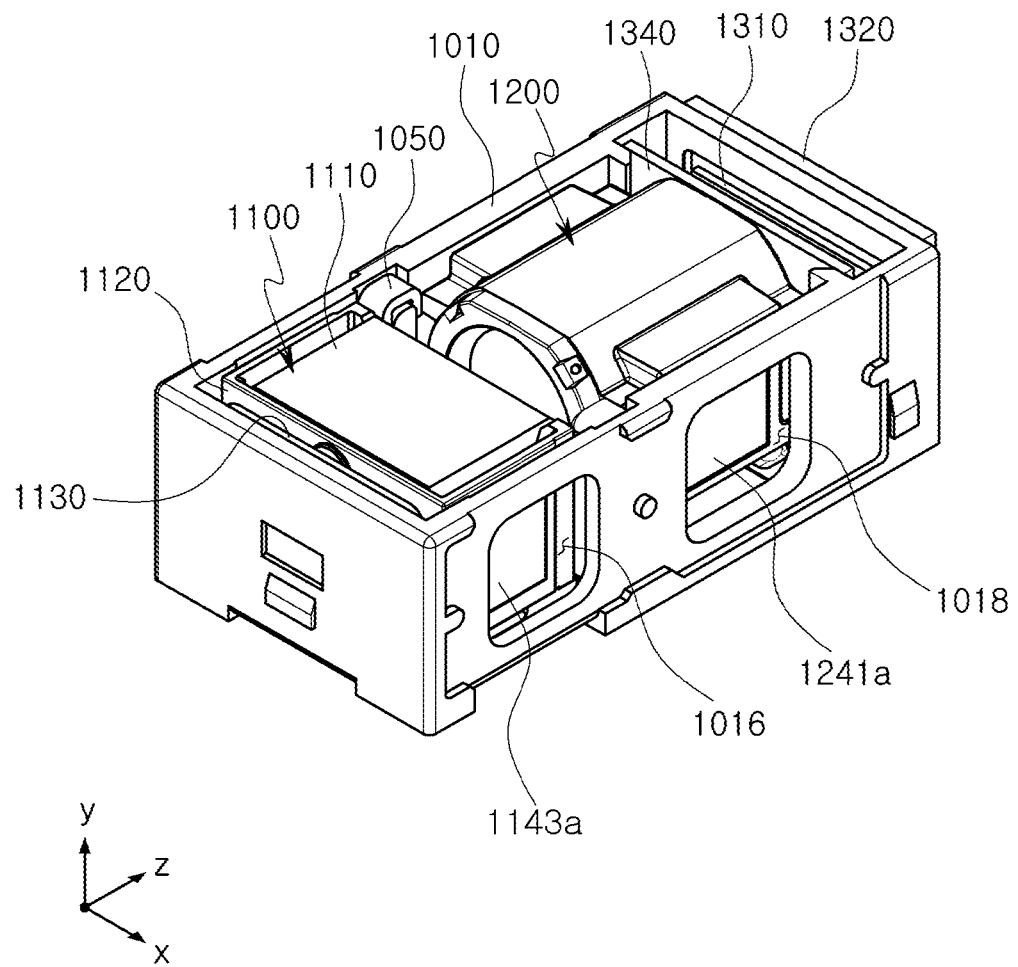
FIG. 8 is a combined perspective view of the other components, except for a cover, in a camera module according to an example.
Figure 9:
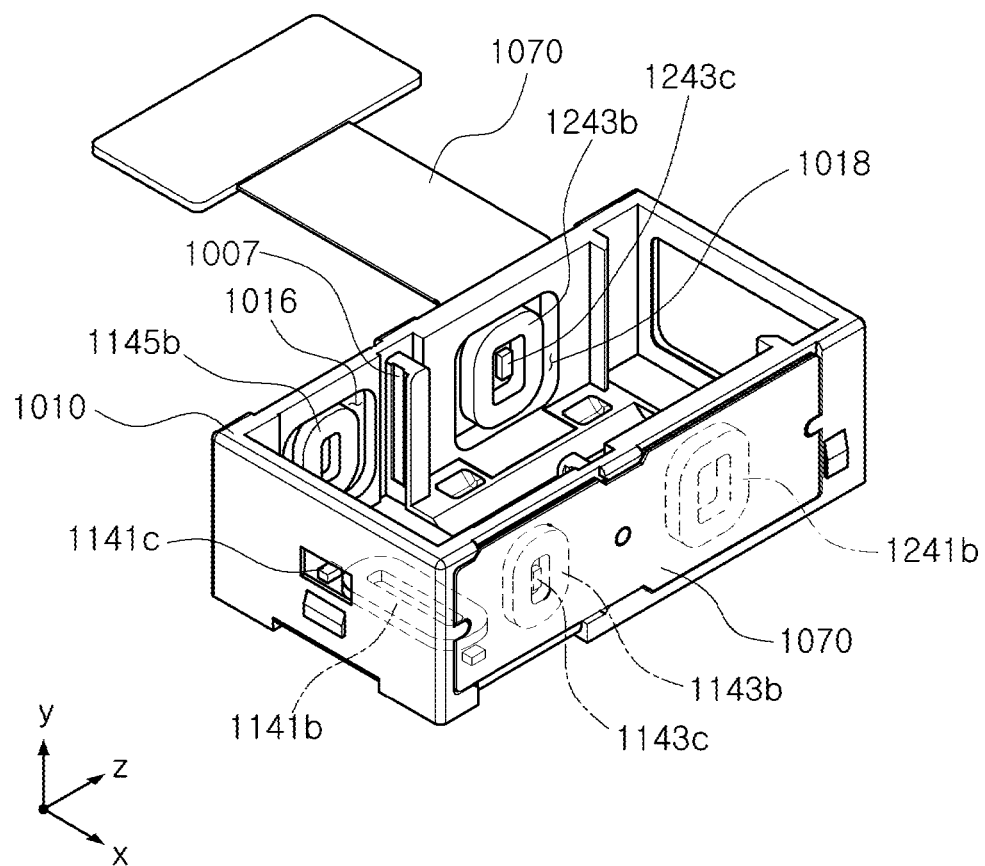
FIG. 9 is a combined perspective view of a housing and a substrate in a camera module according to an example.

FIG. 2 is a perspective view of a camera module according to an example, and FIGS. 3A and 3B are cross-sectional views of a camera module according to an example.

Referring to FIG. 2 and FIGS. 3A and 3B, a camera module 1000 according to an example includes a reflection module 1100, a lens module 1200, and an image sensor module 1300 included in a housing 1010.

The reflection module 1100 is configured to change a direction of light. As an example, the direction of light, incident through an opening 1031 (see FIG. 3A) of a cover 1030 covering an upper portion of the camera module 1000, may be changed by the reflection module 1100 such that the light is directed toward the lens module 1200. To this end, the reflection module 1100 may include a reflection member 1110 reflecting the light.

A path of the light, incident through the opening 1031, is changed by the reflection module 1100 such that the light is directed toward the lens module 1200. For example, a path of light, incident in the thickness direction (the Y-axis direction) of the camera module 1000, may be changed by the reflection module 1100 to significantly match the optical axis direction (a Z-axis direction).

The lens module 1200 includes lenses through which the light, whose direction is changed by the reflection module 1100, passes. The image sensor module 1300 may include an image sensor 1310, configured to convert the light passing through the lenses into an electrical signal, and a printed circuit board (PCB) 1320 on which the image sensor 1310 is mounted. In addition, the image sensor module 1300 may include an optical filter 1340 configured to filter the light incident from the lens module 1200. The optical filter 1340 may be an infrared cut-off filter.

In an internal space of the housing 1010, the reflection module 1100 is provided in front of the lens module 1200, and the image sensor module 1300 is provided in the rear of the lens module 1200.

Referring to FIGS. 2 through 13, the camera module 1000 includes the reflection module 1100, the lens module 1200, and the image sensor module 1300 provided in the housing 1010.

In the housing 1010, the reflection module 1100, the lens module 1200, and the image sensor module 1300 are sequentially provided from one side to the other side along an optical axis direction (Z-axis). The reflection module 1100, the lens module 1200, and the image sensor module 1300 may be accommodated within an internal space of the housing 1010, such that they are inserted into the internal space (in this case, a printed circuit board (PCB) 1320, including the image sensor module 1300, may be attached outside of the housing 1010). For example, as illustrated in the drawings, the housing 1010 may be integrally provided such that both the reflection module 1100 and the lens module 1200 are inserted into the internal space. However, an example of the housing 1010 is not limited to such a configuration. For example, additional housings, respectively accommodating the reflection module 1100 and the lens module 1200 therein, may be interconnected.

The housing 1010 is covered with the cover 1030 such that the internal space is shielded from view from the outside.

The cover 1030 has the opening 1031 through which the light is incident. The light, incident through the opening 1031, is changed in a direction of travel by the reflection module 1100 to be incident on the lens module 1200. The cover 1030 may be integrally provided to cover the entire housing 1010 or may be divided into separate members, respectively covering the reflection module 1100 and the lens module 1200.

The reflection module 1100 includes the reflection member 1110 reflecting light. The light, incident on the lens module 1200, is converted into an electric signal by the image sensor 1310 after passing through a plurality of lenses, and the electrical signal is stored.

The housing 1010 includes accommodates the reflection module 1100 and the lens module 1200 in the internal space thereof. The internal space of the housing 1010 may include a space, in which the reflection module 1100 is disposed, and a space in which the lens module 1200 is disposed, and the spaces may be distinguished from each other by a protrusion wall 1007. The reflection module 1100 may be provided on a front side of the protrusion wall 1007, and the lens module 1200 may be provided on a rear side of the protrusion wall 1007. The protrusion wall 1007 may be formed to protrude from a sidewall of the housing 1010 into the internal space.

The reflection module 1100, provided on the front side of the protrusion wall 1007, has a configuration in which a rotation holder 1120 is brought into close contact with an internal wall surface of the housing 1010 and supported by an attractive force between a pulling yoke 1153, provided on an internal wall surface of the housing 1010, and a pulling magnet 1151 provided on the rotation holder 1120. Although not shown in the drawings, the configuration of the pulling yoke and the pulling magnet mat be reversed, wherein a pulling magnet may be disposed on an internal surface of the housing 1010 and a pulling yoke may be provided on the rotation folder 1120.

A hook-shaped stopper 1050 may be provided. The stopper 1050 may be inserted into/onto the protrusion wall 1007 while supporting the rotation holder 1120 (even when the stopper 1050 is not provided, the rotation holder 1120 may be fixed by the attractive force between the pulling magnet 1151 and the pulling yoke 1153). Since the stopper 1050 is provided with a hook shape, the stopper 1050 may support the rotation holder 1120 while a hook portion is hooked on an upper portion of the protrusion wall 1007. The stopper 1050 may serve as a bracket to support the rotation holder 1120 when the reflection module 1100 is not driven, and may further serve as a stopper to adjust movement of the rotation holder 1120 when the reflection module 1100 is driven. The stopper 1050 may be provided on each of the protrusion walls 1007 protruding from both sides of the housing 1010. A space may be provided between the stopper 1050 and the rotation holder 1120 such that rotation of the rotation holder 1120 may be smoothly performed. The stopper 1050 may be formed of an elastic material such that the rotation holder 1120 may smoothly move while being supported by the stopper 1050.

The housing 1010 includes a first driving part 1140 and a second driving part 1240 to respectively drive the reflection module 1100 and the lens module 1200. The first driving part 1140 includes a plurality of coils 1141*b*, 1143*b*, and 1145*b* to drive the reflection module 1100, and the second driving part 1240 includes a plurality of coils 1241*b* and 1243*b* to drive the lens module 1200. Since the plurality of coils 1141*b*, 1143*b*, 1145*b*, 1241*b*, and 1243*b* are provided in the housing 1010 while being mounted on a mainboard 1070, a plurality of through-holes 1015, 1016, 1017, 1018, 1019 may be formed to expose the plurality of coils 1141*b*, 1143*b*, 1145*b*, 1241*b*, and 1243*b* to the internal space of the housing 1010.

The mainboard 1070, on which the plurality of coils 1141*b*, 1143*b*, 1145*b*, 1241*b*, and 1243*b* are mounted, may be generally connected to be integrally provided, as illustrated in the drawings. In this case, since one terminal is provided, an external power supply and a signal may be easily connected to each other. However, this example is not limited to such a configuration. The mainboard 1070 may be provided with a plurality of boards by, for example, separating a board, on which a coil for the reflection module 1100 is mounted, and a board on which a coil for the lens module 1200 is mounted.

The reflection module 1100 may change a path of the light incident through the opening 1031. When an image or a moving picture is captured, the image may be blurred or the moving picture may be shaken due to hand-shake, or the like, of a user. The reflection module 1100 may correct the hand-shake of the user by moving the rotation holder 1120 on which the reflection member 1110 is mounted. For example, when a shake occurs at the time of capturing the image or the moving picture due to the hand-shake, or the like, of the user, a relative displacement corresponding to the shake is provided to the rotation holder 1120 to compensate for the shake.

Since the OIS function is implemented by the movement of the rotation holder 1120 having a relatively low weight due to absence of lenses, power consumption may be significantly reduced.

For example, light, in which the OIS is performed, may be incident to the lens module 1200 by changing a direction of the light by the movement of the rotation holder 1120, on which the reflection member 1110 is provided without moving a lens barrel including the lenses or an image sensor, in order to implement the OIS function.

The reflection module 1100 includes the rotation holder 1120 provided to be supported on the housing 1010, the reflection member 1110 mounted on the rotation holder 1120, and the first driving part 1140 moving the rotation holder 1120.

The reflection member 1110 changes the traveling direction of the light. For example, the reflection member 1110 may be a mirror or a prism reflecting the light (for ease of description, the reflection member 1110 is illustrated as a prism in drawings associated with the example).

The reflection member 1110 is fixed to the rotation holder 1120. The rotation holder 1120 has a mounted surface 1123 on which the reflection member 1110 is mounted.

The mounted surface 1123 of the rotation holder 1120 is an inclined surface such that the path of the light is changed. For example, the mounted surface 1123 has an inclined surface inclined with respect to the optical axis (the Z axis) of each of the lenses by 30 to 60 degrees. In addition, the inclined surface of the rotation holder 1120 is directed toward the opening 1031 of the cover 1030 through which the light is incident.

The rotation holder 1120, on which the reflection member 1110 is mounted, is movably accommodated in the internal space of the housing 1010. For example, the rotation holder 1120 may be rotated around a first axis (an X axis) and a second axis (a Y axis) in the housing 1010. The first axis (the X axis) and the second axis (the Y axis) may refer to axes perpendicular to an optical axis (a Z axis), and the first axis (X axis) and the second axis (the Y axis) may be perpendicular to each other.

The rotation holder 1120 may be supported on the housing 1010 by first ball bearings 1131, aligned with the first axis (the X axis), and second ball bearings 1133, aligned with the second axis (the Y axis), to facilitate a rotation motion of the rotation holder 1120 about the first axis (the X axis) and the second axis (the Y axis). For example, two first ball bearings 1131, aligned with the first axis (the X axis) and two second ball bearings 1133, aligned with the second axis (the Y axis), are illustrated in the drawings. The first driving part 1140 may rotate about the first axis (the X axis) and the second axis (the Y axis).

The first ball bearings 1131 and the second ball bearings 1133 may be provided on a front surface and a rear surface of a rotation plate 1130, respectively (or the first ball bearings 1131 and the second ball bearings 1133 may be provided on the rear surface and the front surface of the rotation plate 1130, respectively). For example, the first ball bearings 1131 may be aligned with the second axis (the Y axis), and the second ball bearings 1133 may be aligned with the first axis (the X axis). The rotation plate 1130 may be provided between the rotation holder 1120 and an internal side surface of the housing 1010.

The rotation holder 1120 may be supported on the housing 1010 via the rotation plate 1130 by an attractive force between the pulling magnet 1151 and the pulling yoke 1153.

Seating grooves 1132 and 1134 may be formed on the front and rear surfaces of the rotation plate 1130 such that the first ball bearings 1131 and the second ball bearings 1133 are inserted into the respective seating grooves 1132 and 1134. The seating grooves 1132 and 1134 may include first seating grooves 1132, into which portions of the ball bearings 1131 are inserted, and second seating grooves 1134 into which portions of the second ball bearings 1133 are inserted.

The housing 1010 may be provided with third seating grooves 1021 into which portions of the first ball bearings 1131 are inserted, and the rotation holder 1120 may be provided with fourth seating grooves 1121 into which portions of the second ball bearings 1133 are inserted.

The first, second, third, and fourth seating grooves 1132, 1134, 1021, and 1121 may be provided in the shape of a hemispherical or polygonal (polygonal column or polygonal) grooves to easily rotate the first ball bearings 1131 and the second ball bearings 1133 (a depth of a groove may be smaller than a radius thereof to easily rotate the first ball bearings 1131 and the second ball bearings 1133). Portions of the first and second ball bearings 1131 and 1133, not immersed into the groove, may be exposed to easily rotate the rotation plate 1130 and the rotation holder 1120. The first seating grooves 1132, the second seating grooves 1134, the third seating grooves 1021, and the fourth seating groove 1121 may be provided in positions and numbers corresponding to the first ball bearings 1131, aligned with a first axis (an X axis), and the second ball bearings 1133 aligned with a second axis (a Y axis).

The first ball bearings 1131 and the second ball bearings 1133 may serve as bearings while rolling or sliding in the first seating grooves 1132, the second seating grooves 1134, the third seating grooves 1021, and the fourth seating grooves 1121.

Each of the first ball bearings 1131 and the second ball bearings 1133 may have a structure fixed to at least one of the housing 1010, the rotation plate 1130, and the rotation holder 1120. For example, the first ball bearings 1131 may be fixed to the housing 1010 or the rotation plate 1130, and the second ball bearings 1133 may be fixed to the rotation plate 1130 or the rotation holder 1120. In this case, a seating groove may be formed only in a member opposing a member to which the first and second ball bearings 1131 and 1133 are fixed. In this case, the first and second bearings 1131 and 1133 may serve as bearings by sliding motion rather than rotation.

When each of the first ball bearings 1131 and the second ball bearings 1133 has a structure fixed to any one of the housing 1010, the rotation plate 1130, and the rotation holder 1120, the first ball bearings 1131 and the second ball bearings 1133 may be provided in a spherical or hemispherical shape (the hemispherical shape is an example, and the first and second ball bearings 1131 and 1133 may be provided to have a protrusion length greater than or smaller than a hemisphere). A case in which the ball bearings 1131 and 1133 are provided in the shape of a cylinder extending along the first axis (the X axis) and the second axis (the Y axis), may also be applied in the same manner.

After the first ball bearings 1131 and the second ball bearings 1133 are manufactured separately, they may be attached to any one of the housing 1010, the rotation plate 1130 and the rotation holder 1120. Alternatively, the first ball bearings 1131 and the second ball bearings 1133 may be integrally provided when the housing 1010, the rotating plate 1130, and the rotating holder 1120 are manufactured.

The first driving part 1140 generates driving force, such that the rotation holder 1120 is rotatable about two axes.

As an example, the first driving part 1140 includes the plurality of coils 1141*b*, 1143*b*, and 1145*b*, which are disposed to face a plurality of magnets 1141*a*, 1143*a*, and 1145*a*.

When power is applied to the plurality of coils 1141*b*, 1143*b*, and 1145*b*, the rotation holder 1120, on which the magnets 1141*a*, 1143*a*, and 1145*a* are mounted, may rotate about the first axis and the second axis by electromagnetic interaction between the plurality of magnets 1141*a*, 1143*a*, and 1145*a* and the plurality of coils 1141*b*, 1143*b*, and 1145*b*.

The plurality of magnets 1141*a*, 1143*a*, and 1145*a* are mounted on the rotation holder 1120. Magnet 1141*a* may be mounted on a bottom surface of the rotation holder 1120 and magnets 1143*a* and 1145*a* may be mounted on side surfaces of the rotation holder 1120.

The coils 1141*b*, 1143*b*, and 1145*b* are mounted on the housing 1010. As an example, the plurality of coils 1141*b*, 1143*b*, and 1145*b* may be mounted in the housing 1010 via the mainboard 1070. For example, the plurality of coils 1141*b*, 1143*b*, and 1145*b* are provided on the mainboard 1070, and the mainboard 1070 is mounted on the housing 1010. In the drawings, the mainboard 1070 is illustrated as an example in which it is integrally provided such that both a coil for the reflection module 1100 and a coil for the lens module 1200 may be mounted thereon. However, the mainboard 1070 may be divided into two or more boards on which the coil for the reflection module 1100 and the coil for the lens module 1200 may be respectively mounted.

A reinforcing plate, not illustrated, may be mounted on a lower portion of the mainboard 1070 to reinforce the strength.

When the rotation holder 1120 is rotated, a closed loop control manner is used to sense and feedback a position of the rotation holder 1120.

Therefore, position sensors 1141*c* and 1143*c* may be required to perform a closed loop control. The position sensors 1141*c* and 1143*c* may be hall sensors.

The position sensors 1141*c* and 1143*c* may be disposed inside or outside the coils 1141*b* and 1143*b*. The position sensors 1141*c* and 1143*c* may be mounted on the mainboard 1070 on which the coils 1141*b* and 1143*b* are mounted.

The mainboard 1170 may be provided with a gyro sensor, not illustrated, configured to sense a shake factor such as the hand-shake, or the like, of a user, and may be provided with a driver integrated circuit (IC), not illustrated, configured to provide driving signals to the coils 1141b, 1143b, and 1145b.

In this example, a folded module camera may significantly reduce an influence, arising from current applied to a coil, and significantly reduce a deterioration in position sensing accuracy even when a position of a magnet is slightly shifted by an assembly tolerance or an external impact, and may increase sensing sensitivity depending on a relative position with the magnet to improve sensing accuracy.

For example, a dent may be generated in the first to fourth seating grooves 1132, 1134, 1021, and 1121 by the ball bearings 1131 and 1133 due to an external impact or repeated use. In this case, a position of the rotation holder 1120 in an optical axis (Z-axis) direction may be changed. Accordingly, there is a need for a structure in which the sensing accuracy of the hall sensors 1141c and 1143c may be significantly maintained even when the positions of the driving magnets 1141a, 1143a, and 1145a are slightly shifted depending on the change of the position of the rotation holder 1120 in the optical axis direction.

Thus, an example, in which the relative positions of the Hall sensors 1141c and 1143c and the magnets 1141a, 1143a, and 1145a are optimized in consideration of various environmental factors, will be described with reference to FIGS. 10A through 12.

Figure 10A:
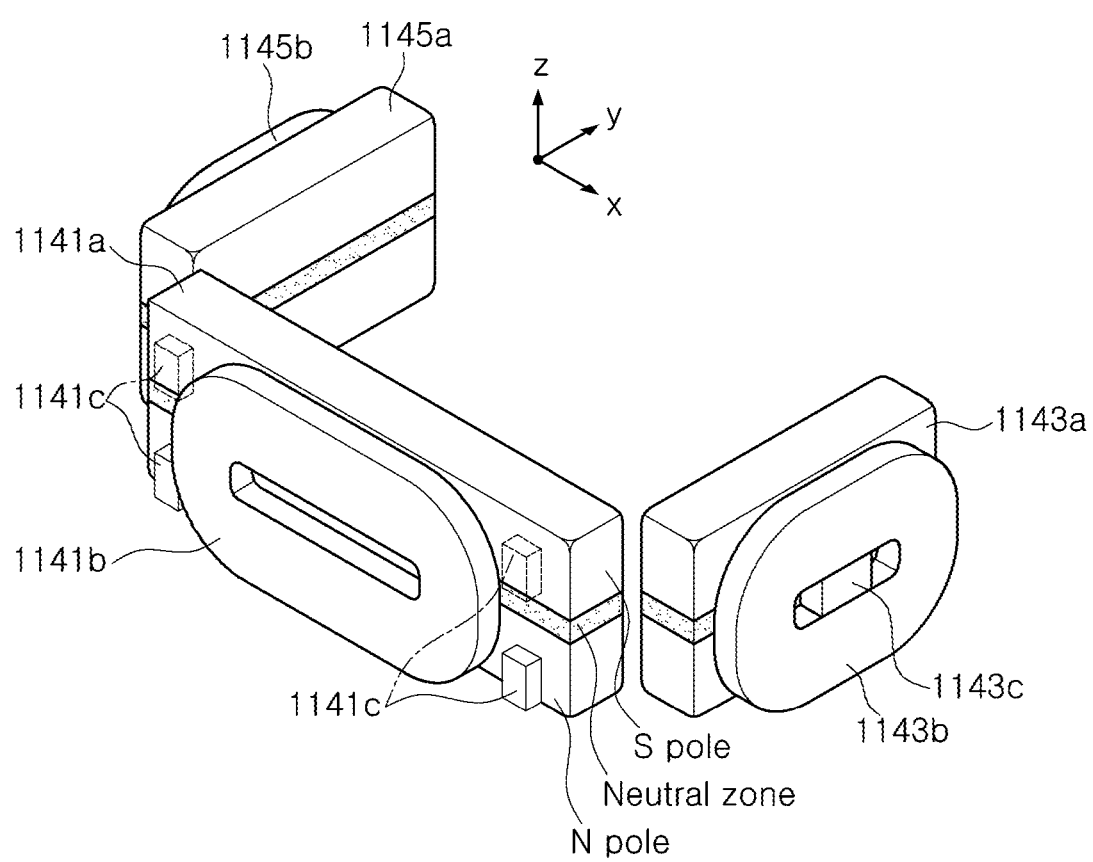
FIGS. 10A and 10B are perspective views illustrating position relationships between a coil for optical image stabilization (OIS), a magnet, and a hall sensor according to an example.

Referring to FIG. 10A, a positional relationship between a coil for optical image stabilization, a magnet, and a hall sensor according to an example is illustrated.

FIG. 10A illustrates a configuration for more accurately sensing a position of the rotation holder 1120 when the rotation holder 1120 is rotated about the first axis (the X axis) to change a relative distance between the magnet 1141a and the hall sensor 1141c in the second axis (the Y axis) direction. For example, the configuration is provided to improve sensitivity between the magnet 1141a, provided on a bottom of the rotation holder 1120, and the hall sensor 1141c provided at the bottom of the housing 1010.

A hall sensor 1141c is provided outside a winding coil 1141b, which is aimed at significantly reducing a position distortion of the hall sensor 1141c occurring when current is applied to the coil 1141b. More specifically, one or two or more hall sensors 1141c may be disposed outside the winding coil 1141b to oppose an N pole or an S pole (in FIG. 10A, the hall sensor is indicated by a solid line when it is disposed to oppose the N pole, and the hall sensor is indicated by a dotted line when it is disposed to oppose the S pole).

The hall sensor 1141c is provided so as to oppose an N pole or an S pole of the magnet 1141a. The hall sensor 1141c may be disposed so as not to oppose a neutral zone in which the N pole and the S pole of the magnet 1141a meet. For example, even when the rotation holder 1120 is rotationally driven about the first axis or the second axis, the hall sensor 1141c may be disposed so as to continuously oppose only the N pole or the S pole and so as not to oppose the neutral zone.

A center of the hall sensor 1141c may be disposed to substantially oppose a center of the N pole or the S pole of the magnet 1141a (a center on an N pole or an S pole of a magnet in a direction from the N pole or the S pole to the S pole or the N pole of the magnet). For example, the hall sensor 1141c may be provided in a position in which a greatest absolute value of magnetic flux density in the N pole or the S pole of the magnet 1141a is sensed.

Figure 11:
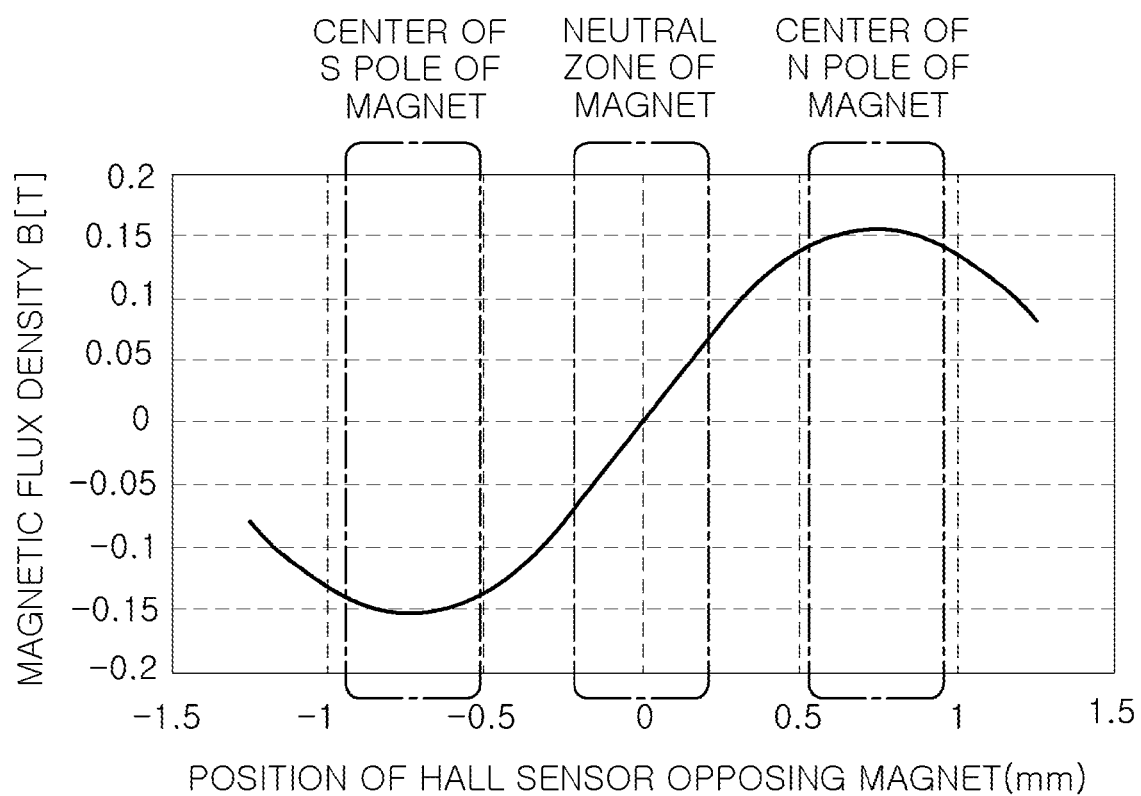
FIG. 11 is a graph illustrating a magnetic flux density value depending on a position of a magnet opposing a hall sensor (a distance between the hall sensor and the magnet is constant).

FIG. 11 is a graph illustrating a magnetic flux density value depending on a position of a magnet opposing a hall sensor (a distance between the hall sensor and the magnet is constant). As can be seen from FIG. 11, when the hall sensor is in a neutral zone of a magnet (a horizontal axis position '0'), a magnetic flux density value, sensed by a hall sensor, is '0' and increases as the hall sensor approaches an N pole or an S pole of a magnet and decreases again after sensing a maximum value when the hall sensor reaches a center of the N pole or the S pole of the magnet.

Referring to FIG. 11, it can be confirmed that when the hall sensor is in the neutral zone of the magnet (the horizontal axis position '0'), the magnetic flux density value is rapidly changed even if the position of the hall sensor is slightly changed, while when the hall sensor is in a center of the N pole or the S pole of the magnet, the magnetic flux density value is not significantly changed even if the position of the hall sensor is slightly changed.

Referring to FIG. 11, it can be confirmed that when the hall sensor is disposed to oppose the center of the N pole or S pole of the magnet, a deterioration in position sensing accuracy, caused by the hall sensor, may be significantly reduced even when a position of the magnet is slightly shifted by an assembly tolerance or external impact.

Accordingly, in this example, the hall sensor 1141c may be located on a position in which the greatest absolute value of the magnetic flux density in the N pole or the S pole of the magnet 1141a is sensed, for example, a position opposing the center of the N pole or the S pole of the magnet 1141a.

Figure 12:
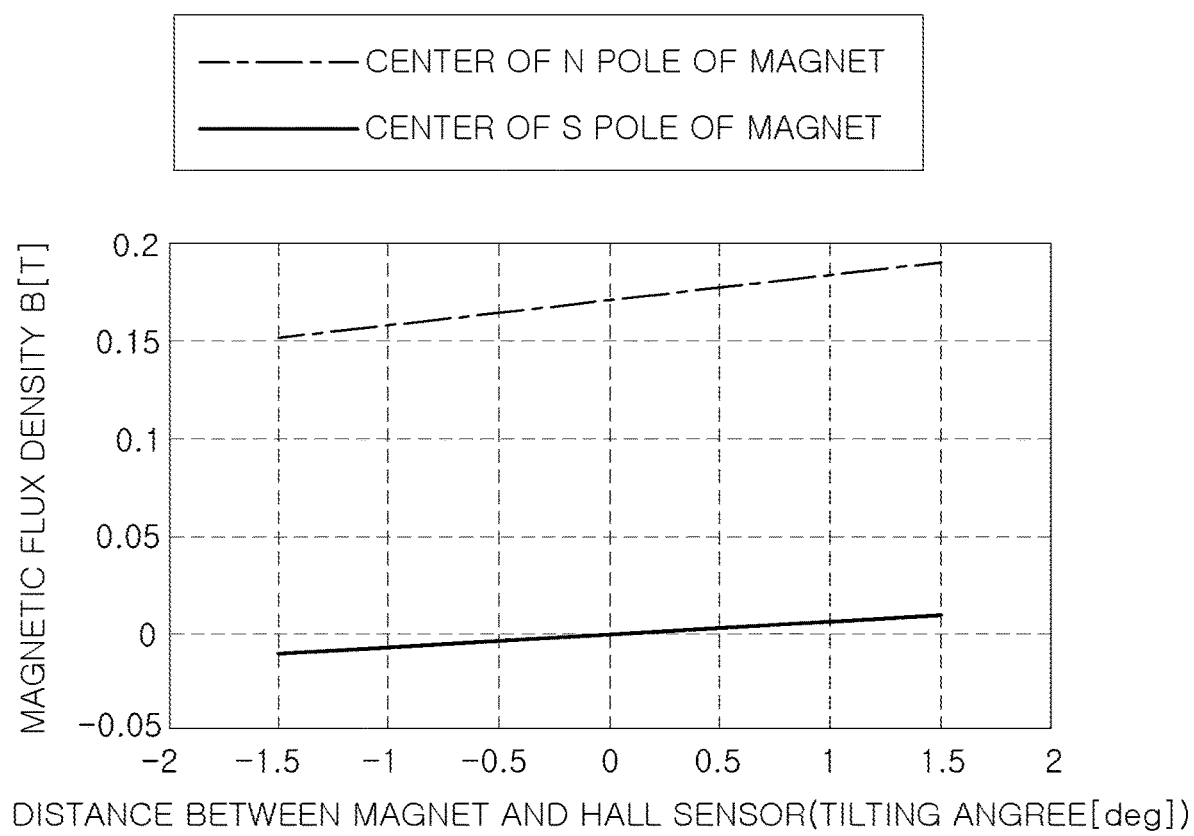
FIG. 12 is a graph illustrating a trend of variation in a magnetic flux density value when a distance between a hall sensor and a magnet varies depending on a position of the magnet opposing the hall sensor.
Figure 13:
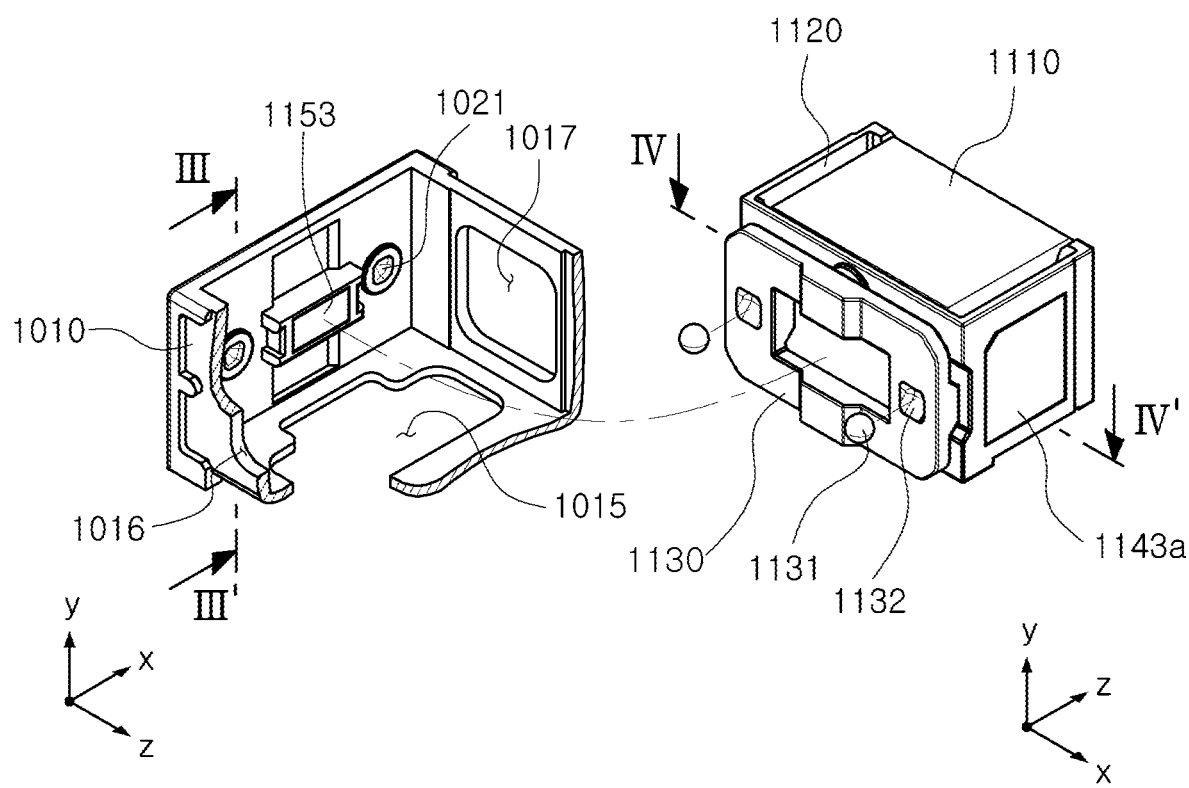
FIG. 13 is an exploded perspective view of a housing and a rotation holder in a camera module according to an example.

FIG. 12 is a graph illustrating a trend of variation in a magnetic flux density value when a distance between a hall sensor and a magnet varies depending on a position of the magnet opposing the hall sensor (depending on whether the hall sensor is disposed to oppose a center of an N pole (an S pole) of a magnet or a neutral zone of the magnet).

As can be seen from an upper portion of FIG. 12, when the hall sensor is disposed on a position opposing the neutral zone of the magnet and the distance between the hall sensor and the magnet changes, a magnetic flux density value is '0' in the center and is linearly increased or decreased in a left or right direction (hereinafter, referred to as "flux density variation trend 1").

As can be seen from a lower portion of FIG. 12, when the hall sensor is disposed on a position opposing the center of the N pole of the magnet and the distance between the hall sensor and the magnet changes, a magnetic flux density is approximately 0.17 in the center (hereinafter referred to as "flux density variation trend 2").

The "flux density variation trend 1" is linearly changed irrespective of whether the hall sensor is opposite to the neutral position of the magnet or opposing to the N pole center, but it is confirmed that sensing sensitivity may vary depending on an opposing position in consideration of the fact that the "flux density variation trend 2" changes in value more rapidly than the "flux density variation trend 1". For example, in the case of the "flux density variation trend 2" sensing sensitivity is greater depending on the distance between the hall sensor and the magnet. When the hall sensor is disposed on a position opposing the center of the N pole or the center of the S pole rather than the neutral zone of the magnet, the position of the magnet (for example, the rotation holder) may be sensed more easily and accurately.

Figure 10B:
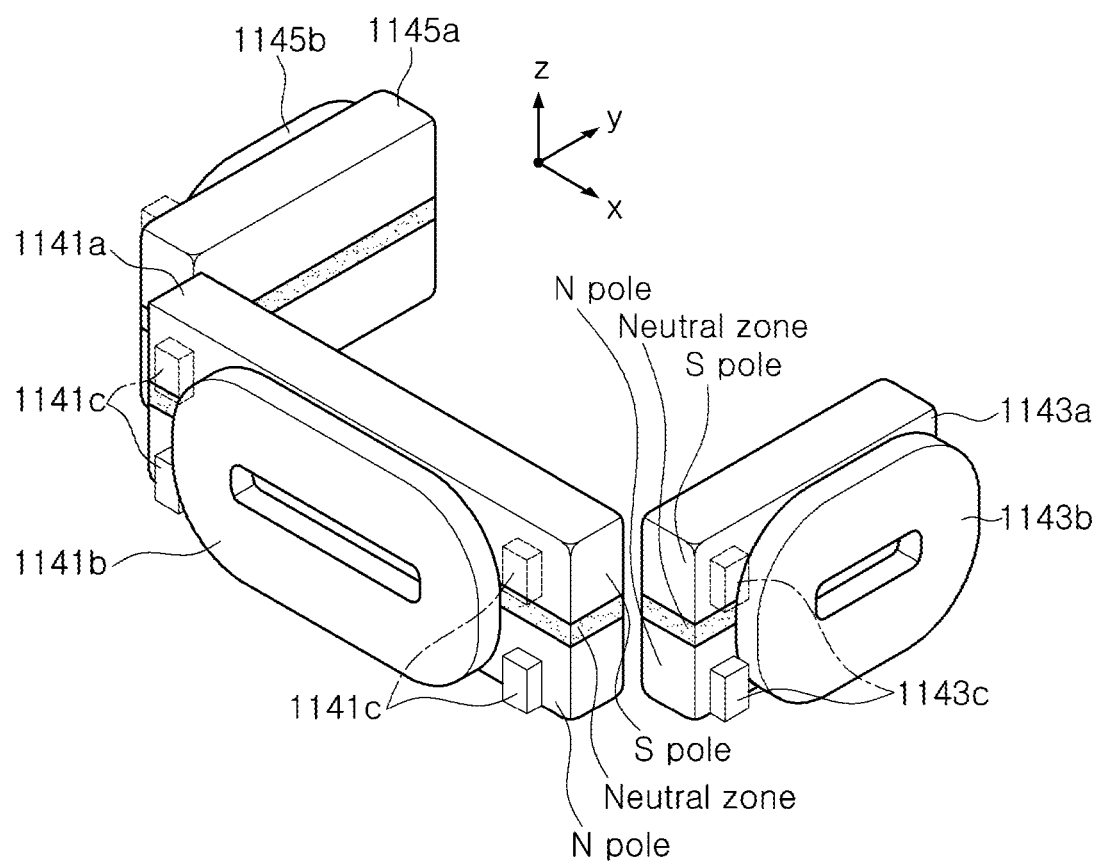

Next, referring to FIG. 10B, positional relationships of a coil for optical image stabilization, a magnet, and a hall sensor according to another example is illustrated.

FIG. 10B illustrates a configuration for more accurately sensing a position of a rotation holder 1120 when the rotation holder 1120 is rotated about a second axis (a Y axis)

to change a relative distance between the magnet 1143a and the hall sensor 1143c, in addition to the configuration for more precisely sensing a position of the rotation holder 1120 when the rotation holder 1120 is rotated about a first axis (an X axis) to change a relative distance between the magnet 1141a and the hall sensor 1141c, described with reference to FIG. 10A. In this case, two magnets 1143a and 1145a and two coils 1143b and 1145b for rotating the rotation holder 1120 about the second axis (the Y axis), may have the same shape and size for the balance of force. A hall sensor, opposing the magnets 1143a and 1145a, may also include a single sensor (on one side of a coil) or two sensors (on both sides of the coil), or two sensors respectively on at least both sides of the coil. Hereinafter, a case, in which a hall sensor 1143c is provided on only one side of a coil 1143b, will be described for ease of description (in a case in which two or more hall sensors are provided, they may be disposed in the same manner as in the example described with reference to FIG. 10A).

For example, FIG. 10B illustrates an improvement in sensing sensitivity between a magnet 1143b, provided on a side surface of a rotation holder 1120, and a hall sensor 1143c provided on a sidewall of the housing 1010, in addition to an improvement in sensing sensitivity between the magnet 1141a, provided on a bottom of the rotation holder 1120, and the hall sensor 1141c provided on a bottom of the housing 1010 of FIG. 10A.

The hall sensor 1143c is provided outside the winding coil 1143b, which is aimed at significantly reducing position distortion of the hall sensor 1143c occurring when current is applied to the coil 1143b. More specifically, one or two or more hall sensors 1143c may be disposed on the outside the winding coil 1143b to oppose an N pole or an S pole (in the FIG. 10B, the hall sensor is indicated by a solid line when it is disposed on the N pole, and the sensor is indicated by a dotted line when it is disposed on the S pole).

The hall sensor 1143c is provided so as to oppose an N pole or an S pole of the magnet 1143a. The hall sensor 1143c may be disposed so as not to oppose a neutral zone in which the N pole and the S pole of the magnet 1143a meet.

The center of the hall sensor 1143c may be disposed to substantially oppose a center of the N pole or the S pole of the magnet 1143a (a center on an N pole or an S pole of a magnet in a direction from the N pole or the S pole to the S pole or the N pole of the magnet). For example, the hall sensor 1143c may be provided on a position in which a greatest absolute value of magnetic flux density in the N pole or the S pole of the magnet 1143a is sensed.

Figure 14A:
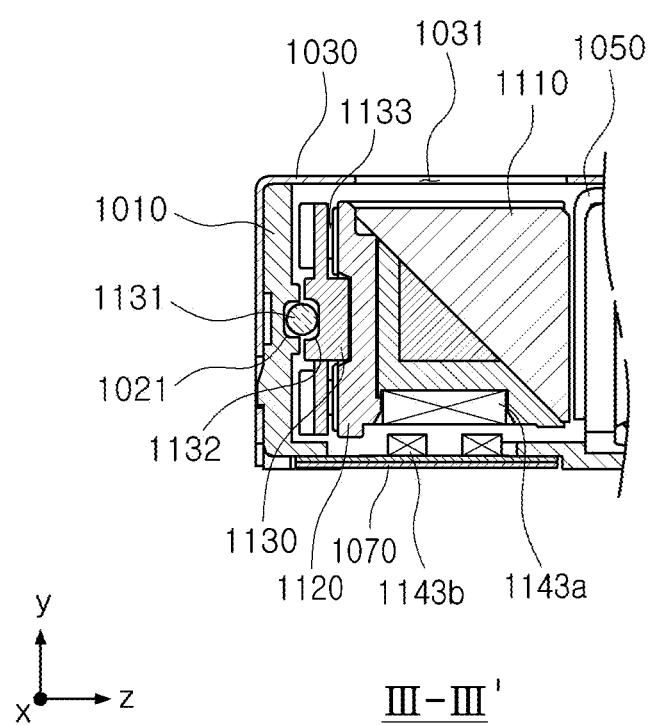
FIGS. 14A, 14B, and 14C are schematic diagrams illustrating a manner in which a rotation holder according to an example rotates about a first axis.
Figure 14B:
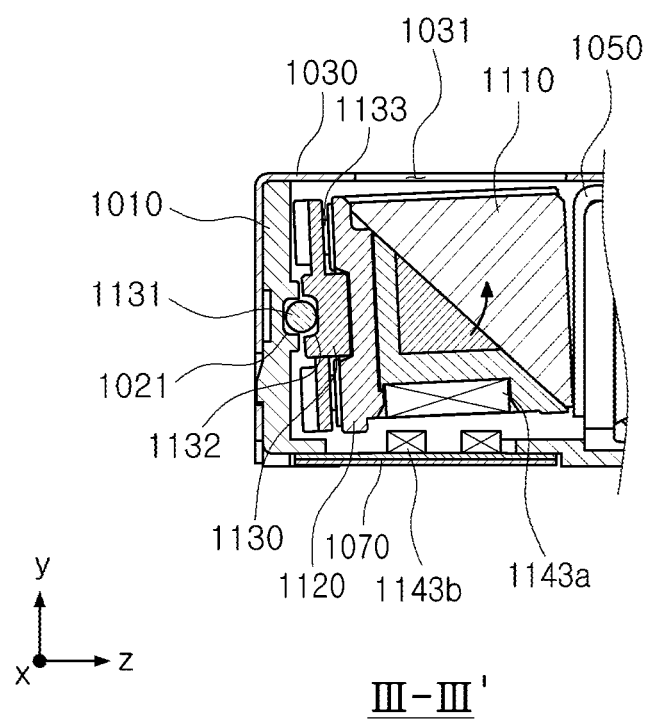
Figure 14C:
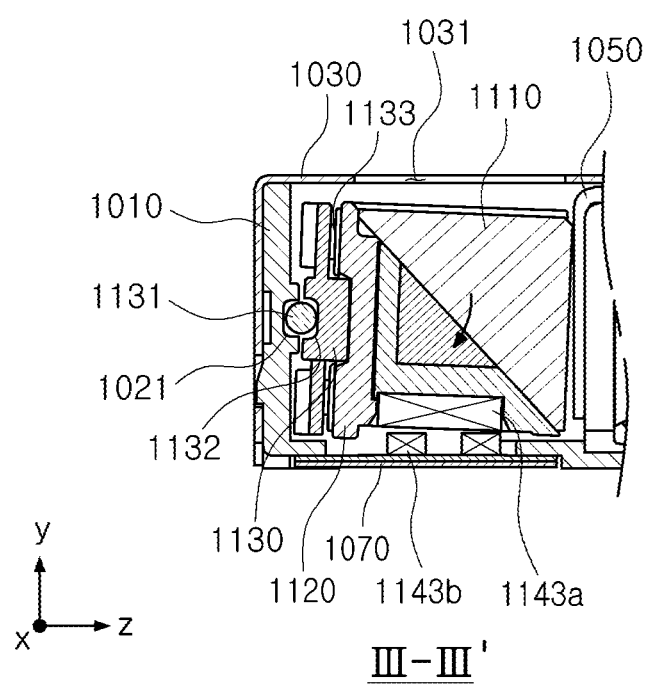
Figure 15A:
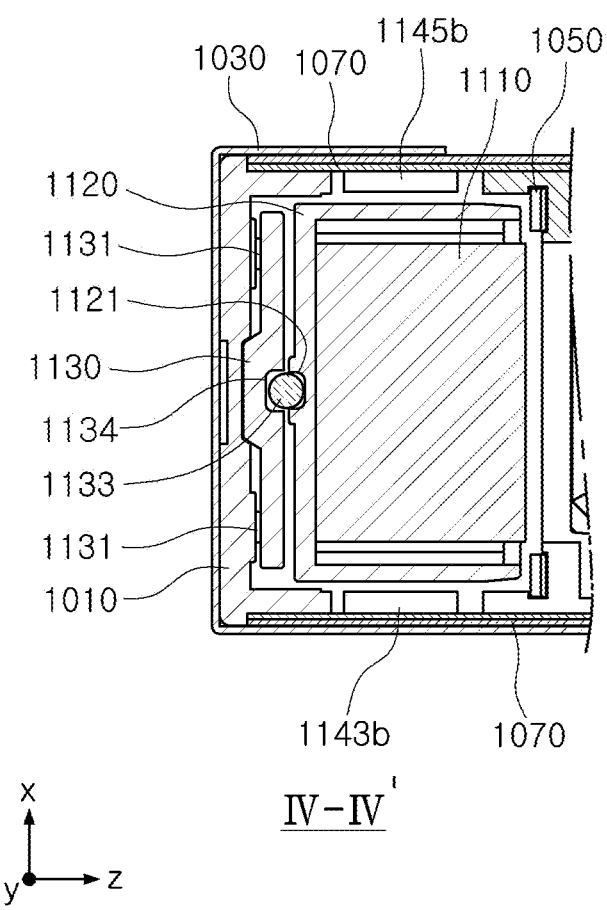
FIGS. 15A, 15B, and 15C are schematic diagrams illustrating a manner in which a rotation holder according to an example rotates about a second axis.
Figure 15B:
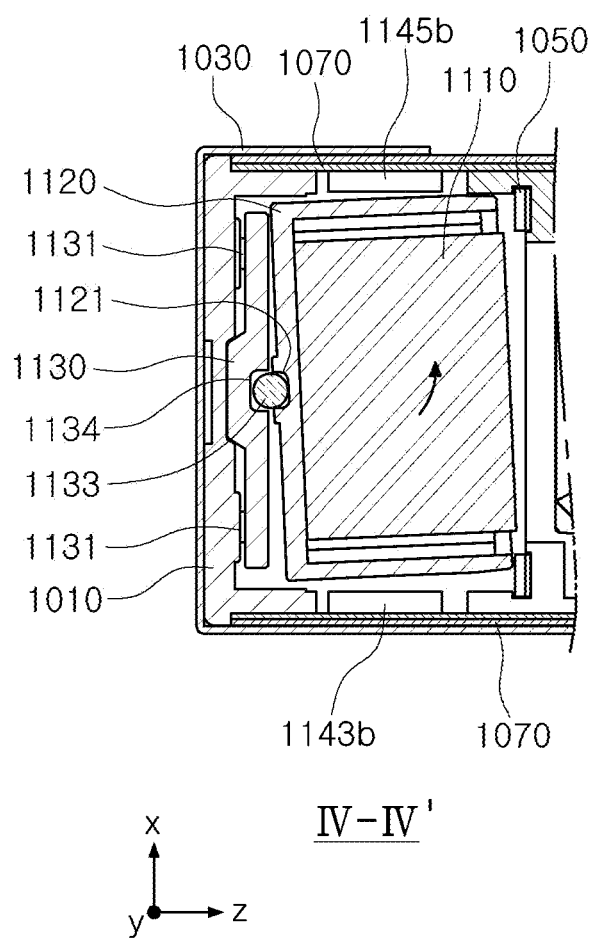
Figure 15C:
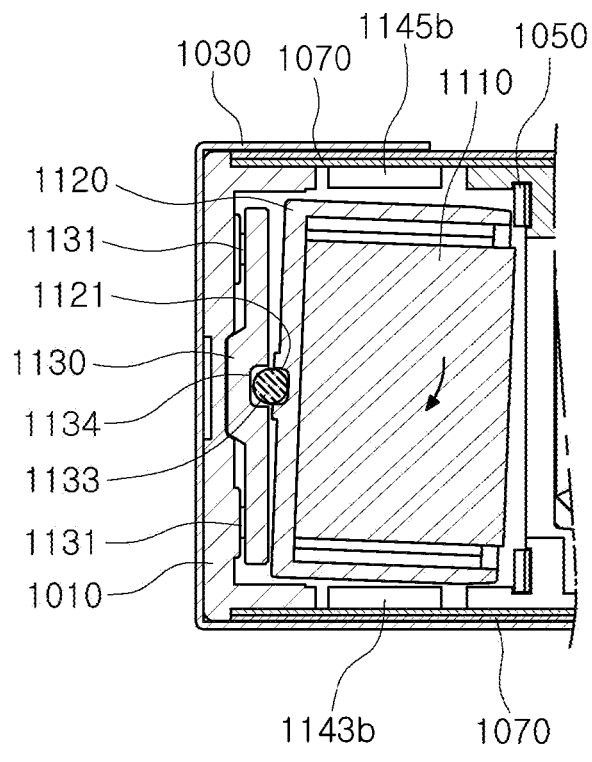

FIGS. 14A through 14C are schematic diagrams illustrating a manner in which a rotation holder according to an example rotates about a first axis, and FIGS. 15A through 15C are schematic diagrams illustrating a manner in which a rotation holder according to an example rotates about a second axis.

Referring to FIGS. 14A through 14C, when rotating about a first axis (an X axis), the rotation plate 1130 rotates while riding on the first ball bearings 1131 arranged along the first axis (the X axis). Thus, the rotation holder 1120 also rotates (in this case, the rotation holder 1120 does not move relative to the rotation plate 1130). Referring to FIGS. 15A through 15C, the rotation holder 1120 rotates while riding on the second ball bearings 1133 arranged along the second axis (the Y axis) (in this case, since the rotation plate 1130 does not rotate, the rotation holder 1120 moves relative to the rotation plate 1130).

For example, the first ball bearings 1131 act when rotating about the first axis (the X axis), and the second ball bearings 1133 act when rotating about the second axis (the Y axis). This is because, as illustrated in the drawings, the second ball bearings 1133, aligned about the second axis (the Y axis), are inserted in seating grooves 1134 and 1121 and cannot be moved when rotating about the first axis (the X axis), and the first ball bearings 1131, aligned about the first axis (the X axis), are inserted in seating grooves 1021 and 1132 and cannot be moved when rotating about the second axis (the Y axis).

Light, having a path changed by the reflection module 1100, is incident on the lens module 1200. Therefore, a plurality of stacked lenses, provided in the lens module 1200, are aligned in a Z axis, a direction in which the light is emitted from the reflection module 1100. The lens module 1200 includes the second driving part 1240 configured to implement autofocusing (AF) and zoom functions. The lens module 1200 is relatively light because it does not include any other components for optical image stabilization (OIS) to implement the AF and zoom functions. Since the relatively light lens module 1200 is moved in an optical axis direction, power consumption may be significantly reduced.

The lens module 1200 includes a lens holder 1220 provided in an internal space of the housing 1010, the lens holder 1220 including a stacked lens therein, and the second driving part 1240 configured to move the lens holder 1220.

A plurality of lenses for capturing an object are accommodated in the lens holder 1220. The plurality of lenses is mounted on the lens holder 1220 along the optical axis.

The light, having a direction of travel changed by the reflection module 1100, passes through the plurality of lenses and is refracted. An optical axis (the Z axis) of the plurality of lenses is formed in a direction perpendicular to a thickness direction (a Y axis direction) of the lens module 1100.

The lens holder 1220 is configured to move in the optical axis (Z axis) direction for AF (autofocus). As an example, the lens holder 1220 may be configured to be movable in a direction in which light, having the direction of travel changed by the reflection module 1100, passes through the plurality of lenses (including an opposite direction thereof).

The second driving part 1240 generates driving force, such that the lens holder 1220 may move in the optical axis (Z-axis) direction. For example, the second driving part 1240 may move the lens holder 1220 to change a distance between the lens holder 1220 and the reflection module 1100.

As an example, the second driving part 1240 includes the plurality of coils 1241b and 1243b, which are disposed to face a plurality of magnets 1241a and 1243a.

When power is applied to the plurality of coils 1241b and 1243b, the lens holder 1220, in which the plurality of magnets 1241 and 1243a are mounted, may be moved in the optical axis (Z axis) direction by an electromagnetic interaction between the plurality of magnets 1241a and 1243a and the plurality of coils 1241b and 1243b.

The magnets 1241a and 1243a are mounted on the lens holder 1220. As an example, the plurality of magnets 1241a and 1243a may be mounted on side surfaces of the lens holder 1220.

The plurality of coils 1241b and 1243b are mounted on the housing 1010. As an example, the mainboard 1070 is mounted in the housing 1010 while the plurality of coils 1241b and 1243b are mounted on mainboard 1070. For ease of description, in the drawings, both a coil for the reflection module 1100 and a coil for the lens module 1200 are illustrated as being mounted, but a configuration thereof is not limited thereto. The mainboard 1070 may be provided as separate boards on which the coil for the reflection module 1100 and the coil for the lens module 1200 are respectively mounted.

In this example, a closed loop control manner is used to sense and feedback a position of the lens holder 1220 when the lens holder 1220 is moved. Accordingly, a position sensor 1243c is required for closed loop control. The position sensor 1243c may be a hall sensor.

The position sensor 1243c may be disposed inside or outside the coil 1243b, and the position sensor 1243c may be mounted on the mainboard 1070 on which the coil 1243b is mounted.

The lens holder 1220 is provided in the housing 1010 to be movable in the optical axis (Z-axis) direction. As an example, a plurality of ball members 1250 are disposed between the lens holder 1220 and the housing 1010.

The plurality of ball members 1250 may serve as bearings to guide movement of the lens holder 1220 during autofocusing (AF). Also, the plurality of ball members 1250 may serve to maintain a gap between the lens holder 1220 and the housing 1010.

The plurality of ball members 1250 are configured to roll in the optical axis (Z-axis) direction when driving force is generated in the optical axis (Z-axis) direction. Accordingly, the plurality of ball members 1250 may guide the movement of the lens holder 1220 in the optical axis (Z-axis) direction.

At least one surface of each of the lens holder 1220 and the housing 1010, facing each other, is respectively provided with a plurality of guide grooves 1221 and 1231 accommodating the plurality of ball members 1250.

The plurality of ball members 1250 are accommodated in the plurality of guide grooves 1221 and 1231 and interposed between the lens holder 1220 and the housing 1010.

The plurality of guide grooves 1221 and 1231 may have a shape having a length in the optical axis (Z-axis) direction.

The movement of the plurality of ball members 1250 in the first axis (the X axis) direction and the second axis (the Y axis) direction is limited while the plurality of ball members 1250 are accommodated in the plurality of guide grooves 1221 and 1231, and may move only in the optical axis (the Z axis) direction. For example, the plurality of ball members 1250 may roll only in the optical axis (the Z axis) direction.

To this end, each of the plurality of guide grooves 1221 and 1231 may be elongated in the optical axis (the z axis) direction. A cross section of each of the plurality of guide grooves 1221 and 1231 may have various shapes such as a round shape, a polygonal shape, and the like.

The lens holder 1220 is pressed toward the housing 1010 such that the plurality of ball members 1250 may maintain contact with the lens holder 1220 and the housing 1010.

To this end, a yoke 1260 may be mounted on the housing 1010 to face the plurality of magnets 1241a and 1243a mounted on the lens holder 1220. The yoke 1260 may be made of a magnetic material.

An attractive force acts between the yoke 1260 and the plurality of magnets 1241a and 1243a. Accordingly, the lens holder 1220 may be moved in the optical axis (the Z axis) direction by driving force of the second driving part 1240 while being in contact with the plurality of ball members 1250.

Figure 16:
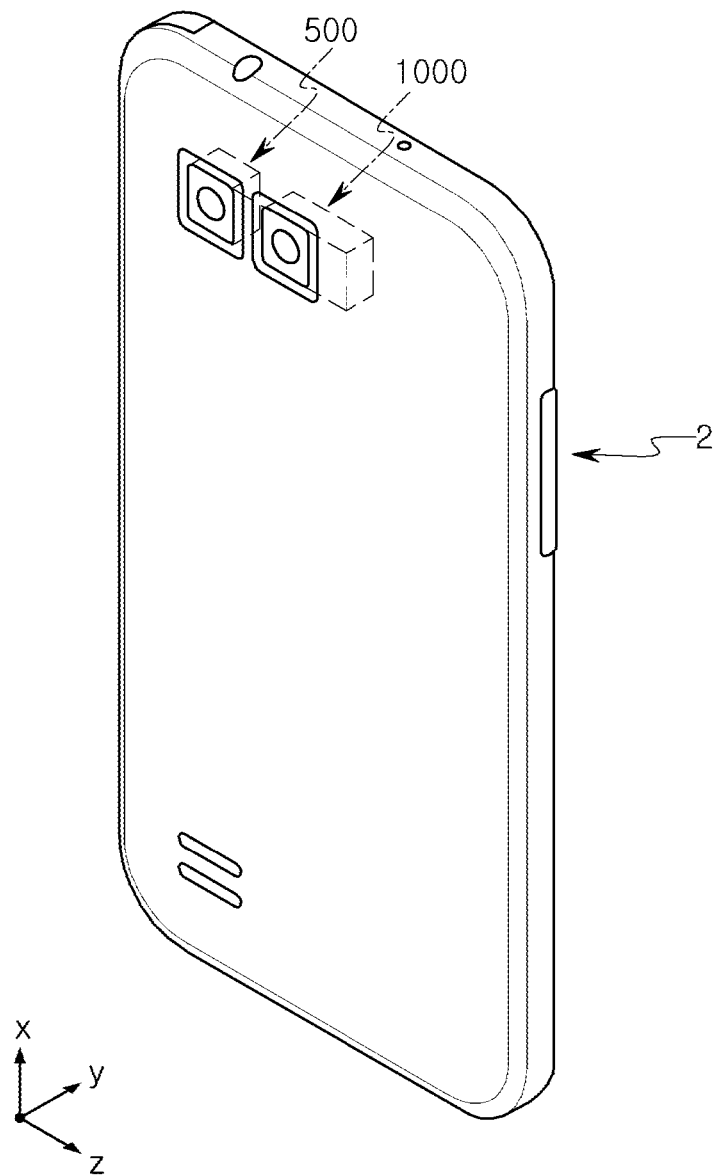
FIG. 16 is a perspective view of a portable electronic device according to another example.

FIG. 16 is a perspective view of a portable electronic device according to another example.

Referring to FIG. 16, a portable electronic device 2 may be a portable electronic device such as a mobile communications terminal, a smartphone, a tablet personal computer (PC), or the like, in which a plurality of camera modules 500 and 1000 are mounted.

In this example, a plurality of camera modules 500 and 1000 may be mounted in the portable electronic device 2.

At least one of the plurality of camera modules 500 and 1000 may be the camera module 1000 according to an example described with reference to FIGS. 2 through 15.

For example, a portable electronic device including a dual camera module may include at least one of the two camera modules as the camera module 1000 according to an example.

According to the above-described examples, the camera module and the portable electronic device including the same may have a simple structure and a reduced size while implementing an autofocusing function, a zoom function, and an OIS function. In addition, power consumption may be significantly reduced.

As described above, a folded camera module according to an example includes a hall sensor which may significantly reduce an influence, arising from current applied to a coil, and significantly reduce a deterioration in position sensing accuracy even when a position of a magnet is slightly shifted by an assembly tolerance or an external impact, and may increase sensing sensitivity depending on a relative position with the magnet to improve sensing accuracy. As a result, the folded camera module may implement more accurate optical image stabilization.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A reflection module for optical image stabilization, comprising:
    a rotation holder comprising a reflection member and supported on an internal wall of a housing; and
    a driving part configured to provide driving force to move the rotation holder,
    wherein the driving part comprises a magnet disposed on the rotation holder, a coil disposed in the housing and opposing the magnet, and a position detection sensor disposed outside of coil windings of the coil, and in the housing and opposing an N pole or an S pole of the magnet, and
    wherein a center of the position detection sensor opposes a center of the N pole of the magnet or a center of the S pole of the magnet.

2. The reflection module for optical image stabilization of claim 1, wherein the coil and the position detection sensor are mounted on a circuit board, and the circuit board is fixed to the housing.

3. The reflection module for optical image stabilization of claim 1, wherein the position detection sensor does not oppose a neutral zone adjacent to where the N pole and the S pole of the magnet meet.

4. The reflection module for optical image stabilization of claim 1, wherein the position detection sensor comprises two position detection sensors, respectively disposed outside opposite sides of the coil windings of the coil.

5. The reflection module for optical image stabilization of claim 1, wherein the magnet is disposed on a bottom surface of the rotation holder, and
the coil is disposed on a bottom surface of the housing.

6. The reflection module for optical image stabilization of claim 1, wherein the rotation holder is configured to rotate such that the reflection member is tilted in a direction perpendicular to an optical axis.

7. A reflection module for optical image stabilization, comprising:
a rotation holder comprising a reflection member and supported on an internal wall of a housing; and
a driving part configured to provide driving force to move the rotation holder,
wherein the driving part comprises a magnet disposed on the rotation holder, a coil disposed in the housing and opposing the magnet, and a position detection sensor disposed in the housing and opposing an N pole or an S pole of the magnet, and
wherein the position detection sensor is disposed on the N pole or the S pole of the magnet at a position in which a greatest absolute value of flux density is sensed.

8. A reflection module for optical image stabilization, comprising:
a rotation holder comprising a reflection member and supported on an internal wall of a housing; and
a driving part configured to provide driving force to move the rotation holder,
wherein the driving part comprises a magnet disposed on the rotation holder, a coil disposed in the housing and opposing the magnet, and a position detection sensor disposed in the housing and opposing an N pole or an S pole of the magnet, and
wherein the position detection sensor has a flux density value varying depending on a relative distance from the magnet.

9. The reflection module for optical image stabilization of claim 8, wherein the position detection sensor has a greater amount of change in the flux density value when the position detection sensor opposes the N pole or the S pole of the magnet than when the position detection sensor opposes a neutral zone of the magnet.

10. A reflection module for optical image stabilization, comprising:
a rotation holder comprising a reflection member and supported on an internal wall of a housing; and
a driving part configured to provide driving force to move the rotation holder,
wherein the driving part comprises a magnet disposed on the rotation holder, a coil disposed in the housing and opposing the magnet, and a position detection sensor disposed in the housing and opposing an N pole or an S pole of the magnet, and
wherein the position detection sensor has a greater flux density value when the position detection sensor opposes the N pole or the S pole of the magnet than when the position detection sensor opposes a neutral zone of the magnet.

11. A camera module comprising:
a housing defining an internal space;
a reflection module disposed in the internal space and comprising:
a rotation holder comprising a reflection member and supported on an internal wall of the housing; and
a driving part configured to provide driving force to move the rotation holder; and
a lens module comprising a lens barrel including a plurality of lenses, and aligned in an optical axis direction such that reflected light is incident on the reflection member,
wherein the driving part comprises a magnet disposed on the rotation holder, a coil disposed in the housing and opposing the magnet, and a position detection sensor disposed in the housing and opposing an N pole or an S pole of the magnet,
wherein a center of the position detection sensor opposes a center of the N pole of the magnet or a center of the S pole of the magnet, and
wherein the lens module is disposed such that the lens barrel is selectively movable along an optical axis.

12. The camera module of claim 11, wherein the position detection sensor comprises at least one position detection sensor that opposes the N pole of the magnet and at least one position detection sensor that opposes the S pole of the magnet.

13. A camera module comprising:
a housing defining an internal space;
a reflection module disposed in the internal space and comprising:
a rotation holder comprising a reflection member and supported on an internal wall of the housing; and
a driving part configured to provide driving force to move the rotation holder; and
a lens module comprising a lens barrel including a plurality of lenses, and aligned in an optical axis direction such that reflected light is incident on the reflection member,
wherein the driving part comprises a magnet disposed on the rotation holder, a coil disposed in the housing and opposing the magnet, two position detection sensors disposed in the housing and opposing an N pole of the magnet, and two position detection sensors disposed in the housing and opposing an S pole of the magnet.

14. The camera module of claim 13, wherein the two position detection sensors disposed in the housing and opposing the N pole of the magnet are disposed on opposite sides of the coil with respect to the optical axis, and the two position detection sensors disposed in the housing and opposing the S pole of the magnet are disposed on the opposite sides of the coil with respect to the optical axis.

15. A reflection module for optical image stabilization, comprising:
a rotation holder comprising a reflection member and supported on an internal wall of a housing; and
a driving part configured to provide driving force to move the rotation holder,
wherein the driving part comprises a magnet disposed on the rotation holder, a coil disposed in the housing and opposing the magnet, and a position detection sensor disposed in the housing and opposing an N pole or an S pole of the magnet such that a center of the position detection sensor opposes a center of the N pole of the magnet or a center of the S pole of the magnet.

* * * * *